(12) United States Patent
Hsueh et al.

(10) Patent No.: US 7,310,281 B1
(45) Date of Patent: Dec. 18, 2007

(54) SEMICONDUCTOR MEMORIES WITH REFRESHING CYCLES

(75) Inventors: Fu-Lung Hsueh, Cranbury, NJ (US); Shine Chung, Taipei Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/514,648

(22) Filed: Sep. 1, 2006

(51) Int. Cl.
*G11C 7/00* (2006.01)
(52) U.S. Cl. .................. 365/222; 365/154; 365/189.02
(58) Field of Classification Search ................ 365/222, 365/154, 189.02
See application file for complete search history.

(56) References Cited

U.S. PATENT DOCUMENTS 6,665,224 B1 * 12/2003 Lehmann et al. .......... 365/222
6,731,528 B2 * 5/2004 Hush et al. ................. 365/222

OTHER PUBLICATIONS

G. Chen, "Dynamic NBTI of PMOS Transistors and Its Impact on Device Lifetime", IEEE Electron Device Letters, vol. 23, No. 12, Dec. 2002.

* cited by examiner

*Primary Examiner*—Huan Hoang
(74) *Attorney, Agent, or Firm*—K & L Gates LLP

(57) ABSTRACT

The present invention discloses a semiconductor memory having an array of storage cells with at least one PMOS transistor, the semiconductor memory comprising at least one mode bit for representing data stored in the array of storage cells are either true or inverted, a plurality of read-toggle drivers coupled on a plurality of data output paths for inverting the data outputs only when the mode bit indicates that the array of storage cells are storing inverted data, and a plurality of write-toggle drivers coupled on a plurality of data input paths for inverting the data inputs only when the mode bit indicates that the array of storage cells are storing inverted data and for writing back inverted data into the array of storage cells during a refreshing cycle.

19 Claims, 3 Drawing Sheets

SEMICONDUCTOR MEMORIES WITH REFRESHING CYCLES

BACKGROUND

The present invention relates generally to semiconductor memory designs and more particularly to the design of semiconductor memories with refreshing cycles.

A constant voltage stress leads to rapid degeneration of transistor parameters, such as threshold voltage and source-drain current. This phenomenon is known as negative bias temperature instability (NBTI) and is the result of charge buildup at an interface between silicon and silicon dioxide due to the influence of negative voltages on the gate electrode of metal-oxide-semiconductor (MOS) structures. The NBTI effect is more severe for P-channel MOS (PMOS) transistors than the N-channel MOS (NMOS) transistors due to the presence of holes in the PMOS inversion layer that react with the oxide states. NBTI degrades the reliability of the PMOS transistor due to the change in threshold voltage and the degradation increases at elevated temperatures and is exponential with electric field across the gate oxide of the PMOS. However, if the stress is periodically interrupted (AC stress), as it would during normal operation, the degradation may be significantly reduced, extending the projected lift-time of the MOS transistors.

A conventional six-transistor static random access memory (SRAM) cell consists of two PMOS transistors and four NMOS transistors. With any data storage in the SRAM cell the effects of NBTI degrade one of the PMOS transistors. If the same data is stored in the SRAM memory cell for an extended period of time, then there is substantial degradation on that PMOS transistor. During the operation of the SRAM, even if the data read and write operations are performed frequently with different data contents, there is a good possibility that some of the SRAM memory cells stored the same high state or low state for an extended period of time. These non-refreshed memory cells will have higher degradation in one of their PMOS transistors due to NBTI that will decrease the reliability of that SRAM cell, as well as the life-time of the entire SRAM memory.

Accordingly, there is a need for a design that can reduce the NBTI degradation of the PMOS transistors through alternating the stress on the PMOS transistors.

SUMMARY

The present invention discloses a semiconductor memory having an array of storage cells with at least one PMOS transistor. In one embodiment the semiconductor memory comprises at least one mode bit for representing data stored in the array of storage cells are either true or inverted, a plurality of read-toggle drivers coupled on a plurality of data output paths for inverting the data outputs only when the mode bit indicates that the array of storage cells are storing inverted data, and a plurality of write-toggle drivers coupled on a plurality of data input paths for inverting the data inputs when the mode bit indicates that the array of storage cells are storing inverted data and for writing back inverted data into the array of storage cells during a refreshing cycle.

The construction and method of operation of the invention, however, together with additional objectives and advantages thereof will be best understood from the following description when read in connection with the accompanying drawings.

DESCRIPTION

The present invention discloses a refreshing system and method for semiconductor memories having at least one P-type metal-oxide-semiconductor (PMOS) transistor in its storage cell. A conventional six-transistor static random access memory (SRAM) is one of such memories.

Figure 1:
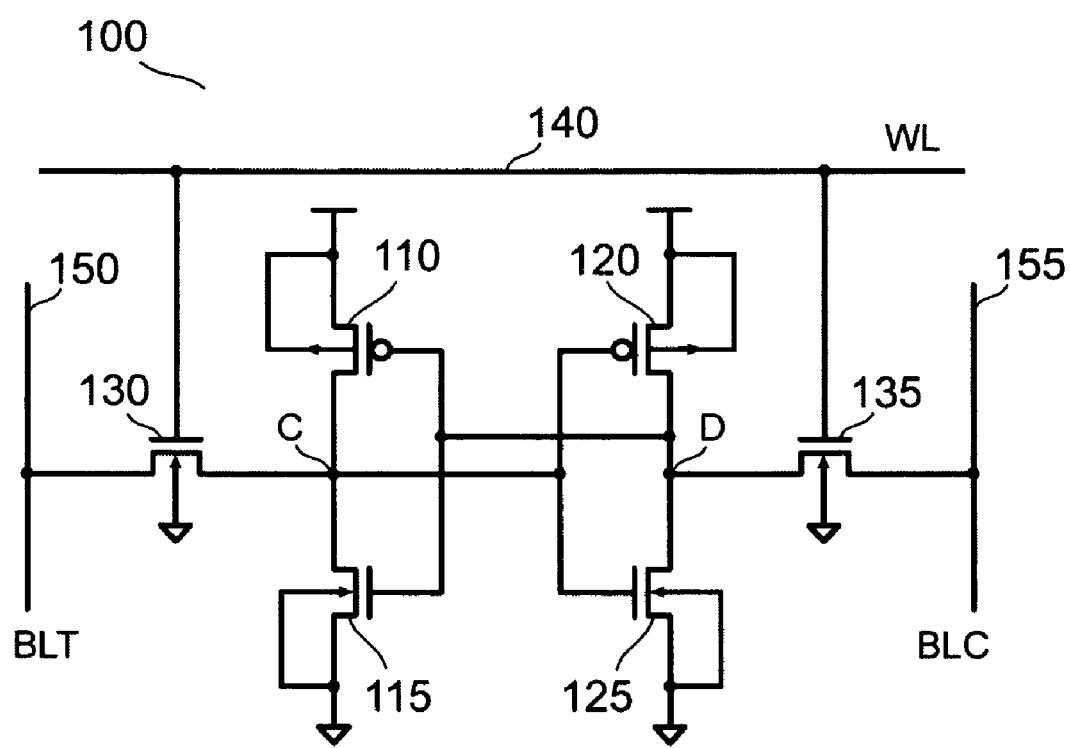
FIG. 1 is a schematic diagram of a conventional six-transistor SRAM cell containing two PMOS transistors that are alternatively on or off.

FIG. 1 illustrates a conventional six-transistor SRAM storage cell 100. The SRAM storage cell 100 may consist of four transistors, 110, 115, 120 and 125, connected as two cross-coupled inverters having two stable states. In other words, either node C is '1' and node D is '0' or vice versa. The cross-coupled inverters can serve as a storage unit. During a stable state, either one of the PMOS transistors 110 or 120 is 'on' and the other is 'off'. A PMOS transistor in the 'on' state is currently stressed. If the SRAM state is not toggled to the 'off' state for an extended period of time, such as days, the stressed PMOS transistor will degrade under negative bias temperature instability (NBTI). Toggling the SRAM cell from time to time can alleviate such degradation.

Referring to FIG. 1, N-type metal-oxide-semiconductor (NMOS) transistors 130 and 135 serve as control gates to the node C and node D, respectively. The NMOS transistors, 130 and 135, together determine whether a SRAM cell can be accessed by a read or write operation.

Figure 2:
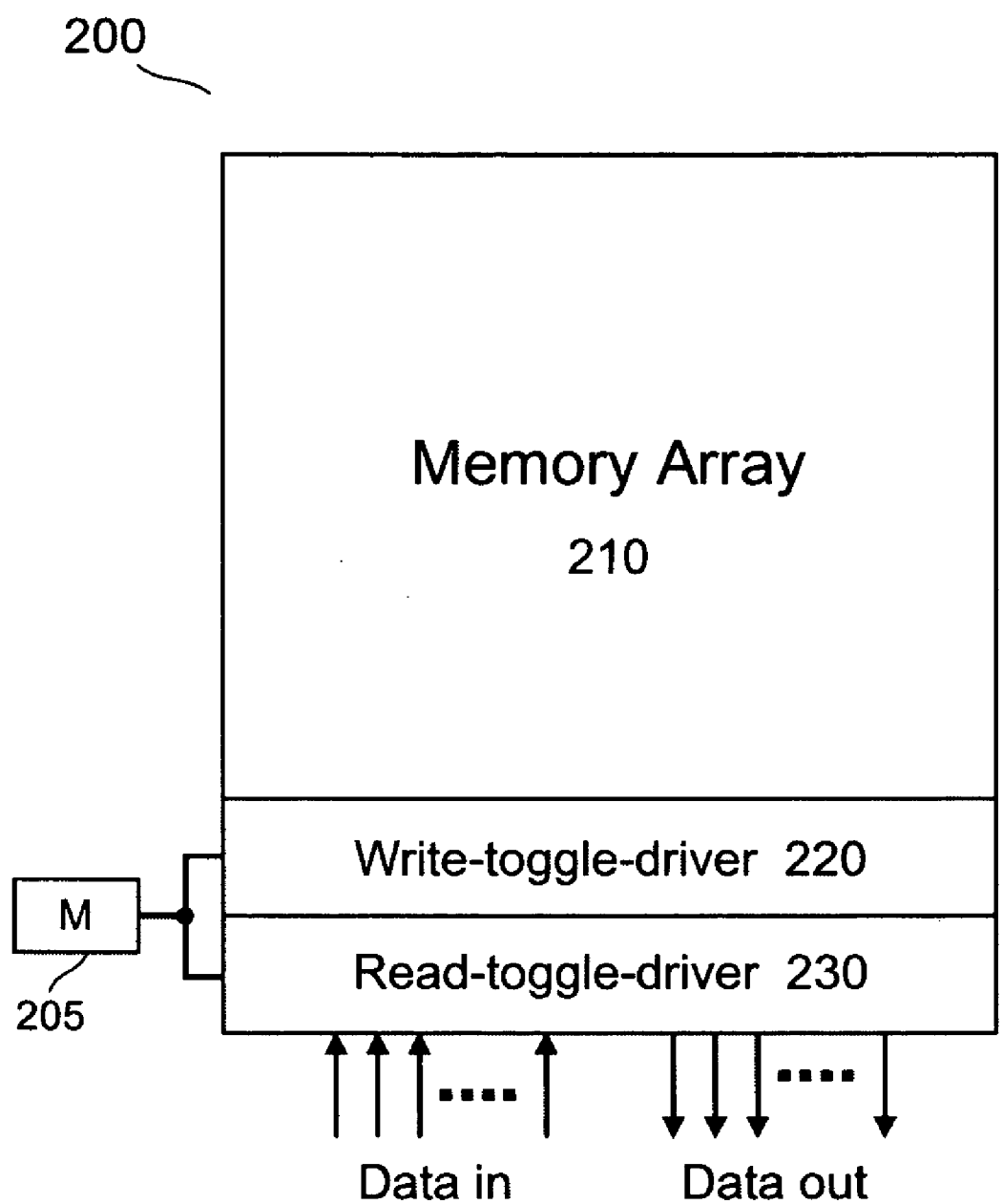
FIG. 2 is a block diagram showing a general concept of a semiconductor memory with a refreshing system according to one embodiment of the present invention.

FIG. 2 is a block diagram showing general concept of a semiconductor memory 200 with a refreshing system according to one embodiment of the present invention. A mode bit 205, which may be a single bit storage unit for storing toggling mode information, is added to or fed to the semiconductor memory 200. The mode bit 205 can be a built-in circuit in the semiconductor memory 200 or has provided external to the memory by a system that includes the memory 200. The semiconductor memory 200 comprises a memory array 210, a write-toggle module 220, and a read-toggle module 230.

Referring to FIG. 2, to prevent NBTI, the entire memory array 210 is toggled periodically by a system that includes the memory 200. After the entire memory array 210 is toggled once, the mode bit 205 is then also toggled once to keep track of the toggling of the memory array 210. Data write-in or data read-out all have to combine with the state of the mode bit 205. For instance, if mode bit 205 being '0' represents the contents of the memory array 210 are inverted, then during writing, the write-toggle module 220 will invert each bit of input data, and during read, the read-toggle module will also invert each bit of output data. Consequently, the net effect is correct data that can be read out. On the other hand, when the mode bit 205 is '1', which means the contents of the memory array 210 are not inverted, then data will either be written or read straight into or out of the memory array 210 without inverting. Because the mode bit 205 records when the entire memory array 210 is toggled, the system that initiates the toggling must also prevent the memory 200 from being interrupted during a toggling cycle. In other words, the memory 200 cannot either read or write because data-out or data-in at this time will be faulty during toggling operation.

Figure 3:
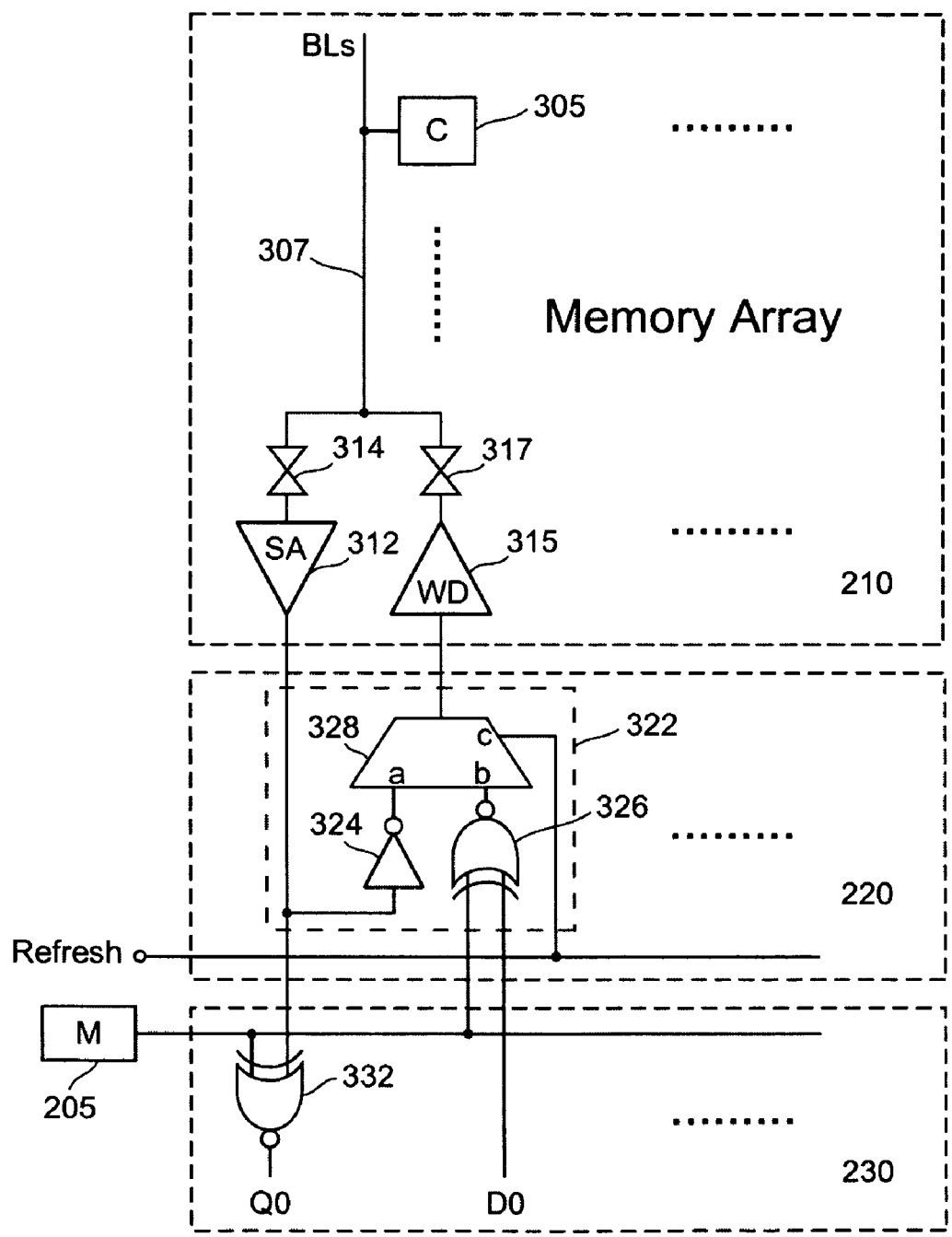
FIG. 3 is a schematic diagram illustrating an implementation of the refreshing system according to one embodiment of the present invention.

FIG. 3 is a schematic diagram illustrating an implementation of the aforementioned refreshing system according to one embodiment of the present invention. Referring to both FIGS. 2 and 3, the memory array 210 may contain a two dimensional array of storage cells 305, rows of sense-amplifier 312 and write-driver 315, transmission gates 314 and 317 connect the bit-line pair 307 either to the sense-amplifier 312 for reading or to the write-driver 315 for writing. A write-toggle module 220 may comprise a plurality of write-toggle drivers 322, each of which is coupled between a data input (e.g., D0) and a corresponding write-driver (e.g., the write-driver 315). A read-toggle module 230 comprises a plurality of read-toggle XNOR gates 332 coupled to the write-toggle module 220.

The write-toggle driver 322 may comprise an inverter 324 and an XNOR gate 326 coupled to two inputs of a multi-plexer 328 and, further coupled to a 'refresh' signal. When the 'refresh' signal is active, the inverter 324 path is selected. As the input of the inverter 324 is connected to the output of the sense-amplifier 312, the refreshing is a process of reading out the state of a storage cell 305, and then writing an inverted state back into that storage cell 305. The system or the semiconductor memory 200 itself scans through all the addresses during a refreshing cycle, and refreshes one storage cell 305 on one address at a time. When all the storage cells 305 of the entire memory array 210 have gone through this read-followed-by-inverted-write process, the entire memory array is refreshed and then the mode bit 205 is toggled once. Note that the memory array here can either mean an entire memory or a block of the memory.

During the normal read or write operation of memory 200, XNOR gates 326 and 332 combine the mode bit 205 state with the cell 305 state. According to this particular embodiment of the present invention, when the mode bit 205 is '1', a true value is stored in the storage cell 305, and when the mode bit 205 is '0', an inverted value is stored in the storage cell 305.

Referring to FIG. 3, during the write operation, the XNOR gate 326 operates on a data bit, e.g., D0, and the mode bit 205. Table 1 shows a XNOR gate truth table. Therefore, when mode bit 205 is a '1', a true value is in the storage cell 305, and when mode bit 205 is a '0', an inverted value should be stored in the storage cell 305. In other words, the mode bit cell 205's reset value is '1', after a cycle of refreshing the mode bit cell 205's value is toggled to '0', representing that inverted data are stored in the memory array 210.

TABLE 1

| Input0 | Input1 | Output |
|---|---|---|
| 0 | 0 | 1 |
| 0 | 1 | 0 |
| 1 | 0 | 0 |
| 1 | 1 | 1 |

Referring to FIG. 3, the reading is to operate on the sense-amplifier 312's output and the mode bit 205 by the read-toggle XNOR gate 332. If the mode bit 205 stores a '1', meaning true data are stored in the memory cells 305, the read-toggle XNOR gate 332 will output the same data as the sense-amplifier's read-out. On the other hand, if the mode bit 205 is a '0', meaning inverted data are stored in the memory cells 305, the read-toggle XNOR gate 332 will output an inverted data of the sense-amplifier's read-out. In this way, when inverted data are stored in the memory array 210, then the read-out will be inverted, so that the true data are always read out. When the true data are stored in the memory array 210, then the read-out will not be inverted, so that the same true data are read out.

Similarly, when XOR gates are used in both the write-toggle module 220 and the read-toggle module 230, then the state '0' of the mode bit 205 represents that true data is stored in the memory array 210, and the state '1' of the mode bit 205 represents that inverted data is stored in the memory array 210.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor memory having an array of storage cells with at least one PMOS transistor, the semiconductor memory comprising:
    at least one mode bit for indicating data stored in the array of storage cells are either true or inverted;
    a plurality of read-toggle drivers coupled on a plurality of data output paths for inverting the data outputs only when the mode bit indicates that the array of storage cells store inverted data; and
    a plurality of write-toggle drivers coupled on a plurality of data input paths for inverting the data inputs only when the mode bit indicates that the array of storage cells store inverted data and for writing back inverted data into the array of storage cells during a refreshing cycle.

2. The semiconductor memory of claim 1, wherein the mode bit is inverted once after the entire array of the storage cells is inverted once.

3. The semiconductor memory of claim 1, wherein the mode bit is programmed in a built-in storage unit in the semiconductor memory.

4. The semiconductor memory of claim 1, wherein the mode bit is provided to the semiconductor memory from an external source.

5. The semiconductor memory of claim 1, wherein the read-toggle driver further comprises at least one XNOR gate operating on the mode bit and a data output from the storage cells, and producing a true data output for the semiconductor memory, wherein a '1' state of the mode bit indicates true data are stored in the array of storage cells, and a '0' state of the mode bit indicates inverted data are stored in the array of storage cells.

6. The semiconductor memory of claim 1, wherein the write-toggle driver further comprises at least one multi-plexer with a first input coupled to a data output of storage cells through odd number of inverters and a second input coupled to the output of an XNOR gate operating on the mode bit and a data input, wherein when a refreshing signal is active, the multiplexer selects the first input, otherwise select the second input, and wherein a '1' state of the mode bit indicates true data are stored in the array of storage cells, and a '0' state of the mode bit indicates inverted data are stored in the array of storage cells.

7. The semiconductor memory of claim 6, wherein the refreshing signal is provided to the semiconductor memory externally.

8. The semiconductor memory of claim 1, wherein the read-toggle driver further comprises at least one XOR gate operating on the mode bit and a data output from the storage cells, and producing a true data output for the semiconductor memory, wherein '0' state of the mode bit indicates true data is stored in the array of storage cells, and a '1' state of the mode bit indicates inverted data are stored in the array of storage cells.

9. The semiconductor memory of claim 1, wherein the write-toggle driver further comprises at least one multiplexer with a first input coupled to a data output of storage cells through odd number of inverters and a second input coupled to the output of an XOR gate operating on the mode bit and a data input, wherein when a refreshing signal is active, the multiplexer selects the first input, otherwise select the second input, and wherein '0' state of the mode bit indicates true data is stored in the array of storage cells, and a '1' state of the mode bit indicates inverted data is stored in the array of storage cells.

10. A semiconductor memory having an array of storage cells with at least one PMOS transistor, the semiconductor memory comprising:

at least one mode bit for indicating data stored in the array of storage cells are either true or inverted, wherein the mode bit is inverted once after the entire array of the storage cells is inverted once;

a plurality of read-toggle drivers coupled on a plurality of data output paths for inverting the data outputs only when the mode bit indicates that the array of storage cells are storing inverted data; and a plurality of write-toggle drivers coupled on a plurality of data input paths for inverting the data inputs only when the mode bit indicates that the array of storage cells are storing inverted data and for writing back inverted data into the array of storage cells during a refreshing cycle.

11. The semiconductor memory of claim 10, wherein the read-toggle driver further comprises at least one XNOR gate operating on the mode bit and a data output from the storage cells, and producing a true data output for the semiconductor memory, wherein a '1' state of the mode bit indicates true data is stored in the array of storage cells, and a '0' state of the mode bit indicates inverted data are stored in the array of storage cells.

12. The semiconductor memory of claim 10, wherein the write-toggle driver further comprises at least one multiplexer with a first input coupled to a data output of storage cells through odd number of inverters and a second input coupled to the output of an XNOR gate operating on the mode bit and a data input, wherein when a refreshing signal which is provided by a system that uses the semiconductor memory, is active, the multiplexer selects the first input, otherwise select the second input, and wherein a '1' state of the mode bit indicates true data are stored in the array of storage cells, and a '0' state of the mode bit indicates inverted data is stored in the array of storage cells.

13. The semiconductor memory of claim 10, wherein the read-toggle driver further comprises at least, one XOR gate operating on the mode bit and a data output from the storage cells, and producing a true data output for the semiconductor memory, wherein a '0' state of the mode bit indicates true data is stored in the array of storage cells, and a '1' state of the mode bit indicates inverted data is stored in the array of storage cells.

14. The semiconductor memory of claim 10 wherein the write-toggle driver further comprises at least one multiplexer with a first input coupled to a data output of storage cells through odd number of inverters and a second input coupled to the output of an XOR gate operating on the mode bit and a data input, wherein when a refreshing signal is active, the multiplexer selects the first input, otherwise select the second input, and wherein a '0' state of the mode bit indicates true data are stored in the array of storage cells, and a '1' state of the mode bit indicates inverted data is stored in the array of storage cells.

15. A static random access memory (SRAM) having an array of storage cells with at least one PMOS transistor, the SRAM comprising:

at least one mode bit for indicating data stored in the storage cells are either true or inverted, wherein the mode bit is inverted once after the entire array of the storage cells is inverted once;

a plurality of read-toggle drivers coupled on a plurality of data output paths for inverting the data outputs only when the mode bit indicates that the array of storage cells are storing inverted data; and a plurality of write-toggle drivers coupled on a plurality of data input paths for inverting the data inputs only when the mode bit indicates that the array of storage cells are storing inverted data and for writing back inverted data into the array of storage cells during a refreshing cycle.

16. The SRAM of claim 15, wherein the read-toggle driver further comprises at least one XNOR gate operating on the mode bit and a data output from the storage cells, and producing a true data output for the SRAM, wherein a '1' state of the mode bit indicates true data is stored in the array of storage cells, and a '0' state of the mode bit indicates inverted data are stored in the array of storage cells.

17. The SRAM of claim 15, wherein the write-toggle driver further comprises at least one multiplexer with a first input coupled to a data output of the storage cells through odd number of inverters and a second input coupled to the output of an XNOR gate operating on the mode bit and a data input, wherein when a refreshing signal which is provided by a system that uses the semiconductor memory, is active, the multiplexer selects the first input, otherwise select the second input, and wherein a '1' state of the mode bit indicates true data are stored in the array of storage cells, and a '0' state of the mode bit indicates inverted data are stored in the array of storage cells.

18. The SRAM of claim 15, wherein the read-toggle driver further comprises at least one XOR gate operating on the mode bit and a data output from the storage cells, and producing a true data output for the semiconductor memory, wherein a '0' state of the mode bit indicates true data are stored in the array of storage cells, and a '1' state of the mode bit indicates inverted data are stored in the array of storage cells.

19. The SRAM of claim 15 wherein the write-toggle driver further comprises at least one multiplexer with a first input coupled to a data output of storage cells through odd number of inverters and a second input coupled to the output of an XOR gate operating on the mode bit and a data input, wherein when a refreshing signal is active, the multiplexer selects the first input, otherwise select the second input, and wherein a '0' state of the mode bit indicates true data are stored in the array of storage cells, and a '1' state of the mode bit indicates inverted data is stored in the array of storage cells.

* * * * *